(12) United States Patent
Kobayashi

(10) Patent No.: US 6,433,594 B1
(45) Date of Patent: Aug. 13, 2002

(54) SEMICONDUCTOR INTEGRATED CIRCUIT AND SEMICONDUCTOR INTEGRATED CIRCUIT SYSTEM

(75) Inventor: Soichi Kobayashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/794,028

(22) Filed: Feb. 28, 2001

(30) Foreign Application Priority Data

Sep. 22, 2000 (JP) ........................................ 2000-289374

(51) Int. Cl.[7] ................................................ H03B 1/00
(52) U.S. Cl. ........................................ 327/111; 257/371
(58) Field of Search ................................ 327/111, 112, 327/107, 108, 427, 143, 310, 312, 379; 326/83, 86, 56, 57, 58; 257/371, 541, 550, 274; 438/233, 153

(56) References Cited

U.S. PATENT DOCUMENTS

| | | | | |
|---|---|---|---|---|
| 4,951,114 A | * | 8/1990 | Lewis et al. | 257/274 |
| 4,961,010 A | * | 10/1990 | Davis | 326/58 |
| 5,364,810 A | * | 11/1994 | Kosa et al. | 438/153 |
| 5,497,285 A | * | 3/1996 | Nadd | 327/429 |
| 5,512,497 A | * | 4/1996 | Ikeda et al. | 438/233 |
| 5,880,603 A | * | 3/1999 | Shigehara et al. | 326/81 |
| 6,225,844 B1 | * | 5/2001 | Fujiwara | 327/112 |

FOREIGN PATENT DOCUMENTS

| | | | |
|---|---|---|---|
| JP | 5-95274 | | 4/1993 |
| JP | 05095274 | * | 4/1993 |
| JP | 8-335126 | | 12/1996 |

OTHER PUBLICATIONS

Masakazu Shoji, "CMOS Digital Circuit Technology", Chapter 2, pp., 78–83, 1988.

* cited by examiner

*Primary Examiner*—Timothy P. Callahan
*Assistant Examiner*—Linh Nguyen
(74) *Attorney, Agent, or Firm*—Leydig,Voit & Mayer, Ltd.

(57) ABSTRACT

A signal output circuit includes a first NMOS transistor that supplies the potential of its drain as output data to an output terminal that has been pulled up to a high power source voltage. This signal output circuit includes a second NMOS transistor having input to its gate a control signal that becomes a high logical level when there is no power supplied, and having its drain connected to the gate of the first NMOS transistor.

12 Claims, 10 Drawing Sheets

OUTPUT ENABLE SIGNAL
OUTPUT DATA

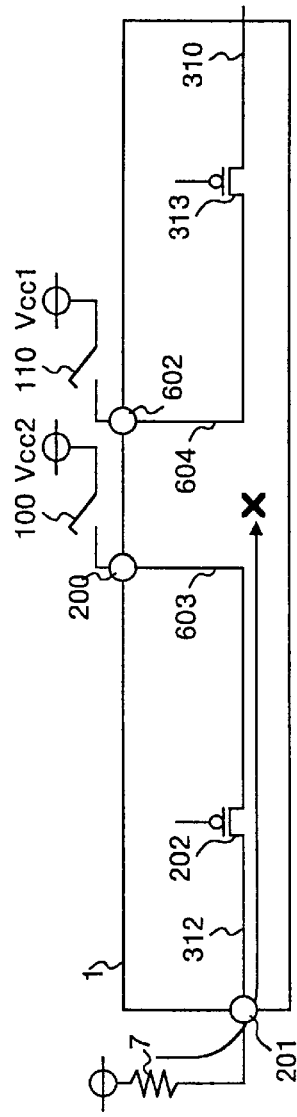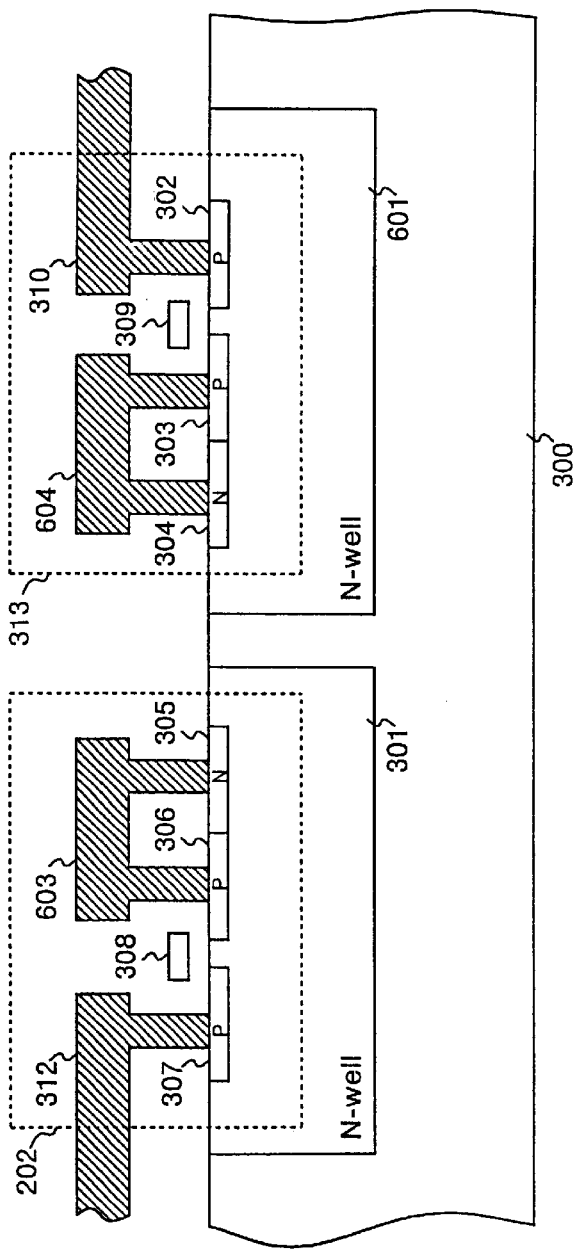

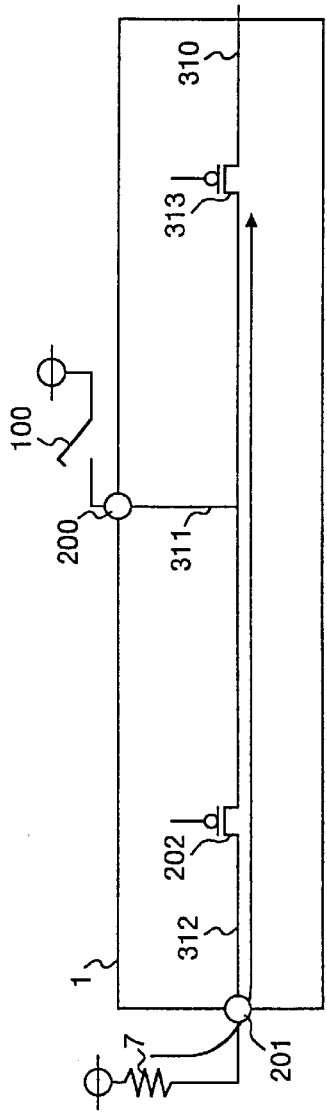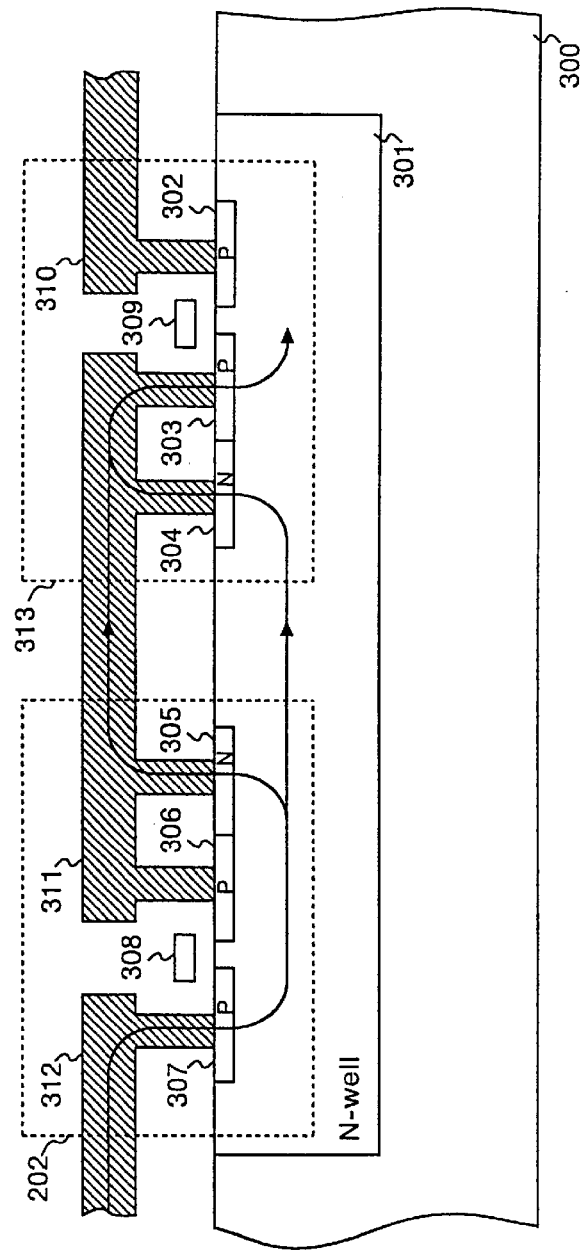
FIG.13A
FIG.13B

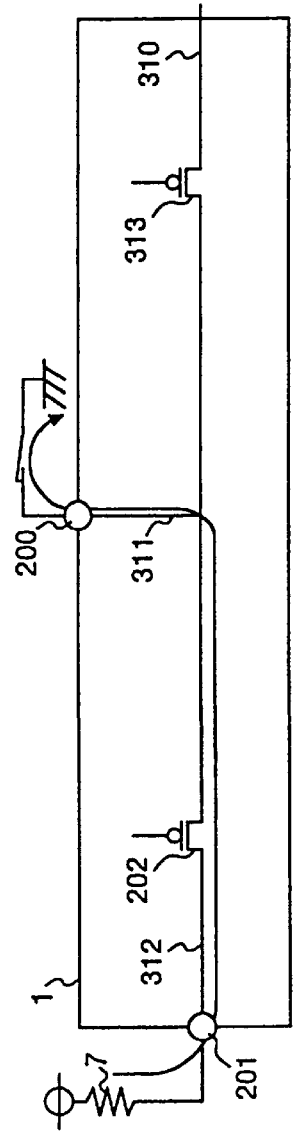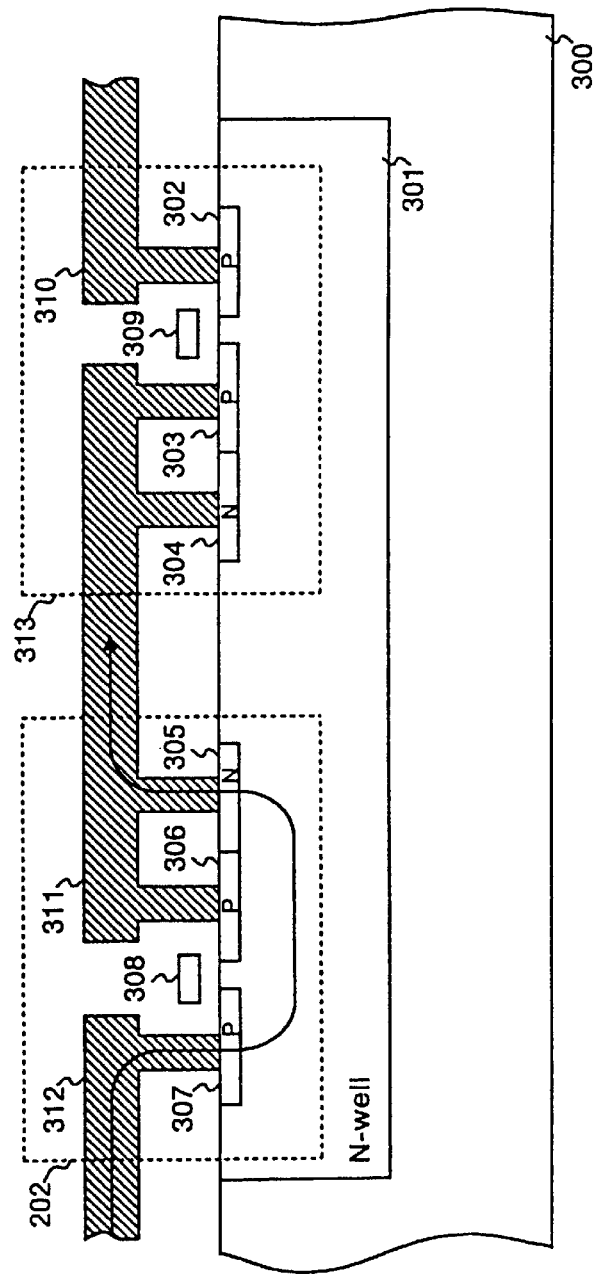

_(US 6,433,594 B1)_

SEMICONDUCTOR INTEGRATED CIRCUIT AND SEMICONDUCTOR INTEGRATED CIRCUIT SYSTEM

FIELD OF THE INVENTION

The present invention relates to a semiconductor integrated circuit and a semiconductor integrated circuit system capable of completely cutting off a current flowing to and from the outside when a supply of a power source voltage is stopped.

BACKGROUND OF THE INVENTION

Among one-chipped semiconductor integrated circuits and semiconductor integrated circuit systems having a plurality of such semiconductor integrated circuits provided on the same one printed circuit board, some of them are equipped with means for stopping a power source of a part of the semiconductor integrated circuits in order to eliminate power that is consumed in non-operating circuit portions. Particularly, it is essential that such means are loaded onto the semiconductor integrated circuits or the semiconductor integrated circuit systems that are operated by batteries as their power source.

FIG. 11 is a block diagram showing a schematic configuration of a conventional representative semiconductor integrated circuit system. In FIG. 11, a semiconductor integrated circuit system has peripheral ICs 1 to 3, a CPU 4 and a memory 5 structured as a plurality of semiconductor integrated circuits. Particularly, these semiconductor integrated circuits carry out data input/output via a bus 6 pulled up to a high power source voltage by a pull-up resistor 7.

In the system having this structure, it is not necessary to keep the peripheral ICs 1 to 3 operated at all times. Therefore, the power supply to all or a part of the peripheral ICs 1 to 3 is cut off during a specific period, thereby to save power.

FIG. 12 is a diagram for explaining the operation of a signal output circuit of the conventional peripheral IC. In FIG. 12, a peripheral IC1 has a power source terminal 200 and an output terminal 201 connected to a data bus 6. Inside this peripheral IC1, there is provided a signal output circuit that consists of a PMOS transistor 202 having its source connected to the power source terminal 200 and its drain connected to the output terminal 201, an NMOS transistor 203 having its source grounded and its drain connected to the output terminal 201, a NAND gage 204, an NOR gate 205, and an inverter 206.

The NAND gate 204 inputs an output enable signal to one input terminal, inputs output data to the other input terminal, and connects an output terminal to the gate of the PMOS transistor 202. The inverter 206 inputs the output enable signal, and applies its inverted output to one input terminal of the NOR gate 205. The NOR gate 205 has an input of the above output data to the other input terminal, and connects its output terminal to a gate of the NMOS transistor 203.

Based on the above structure, this signal output circuit operates as follows. When the output enable signal is at low logical level (hereafter logic level "L"), the PMOS transistor 202 and the NMOS transistor 203 are both turned OFF. In other words, a signal output from the output terminal 201 of the peripheral IC1 becomes in an undefined state regardless of the logic level of the output data. On the other hand, when the output enable signal is at high logical level (hereafter logic level "H") and also when the output data is at the logic level "H", the PMOS transistor 202 becomes in the ON state and the NMOS transistor 203 becomes in the OFF state. Therefore, a potential equal to the power source voltage supplied to the power source terminal 200 is applied to the output terminal 201, and the logic level "H" is output.

Further, when the output enable signal is at the logic level "H" and also when the output data is at the logic level "L", the PMOS transistor 202 becomes in the OFF state and the NMOS transistor 203 becomes in the ON state. Therefore, the potential of the output terminal 201 becomes equal to the ground potential, and the logic level "L" is output. In other words, when the output enable signal is at the logic level "H", a signal of the logic level shown by the output data is output straight from the output terminal 201 via the drain to which the PMOS transistor 202 and the NMOS transistor 203 are mutually connected.

FIG. 13A is a circuit diagram, and FIG. 13B is a layout cross-sectional diagram of the PMOS transistor that constitutes a signal output circuit in a semiconductor integrated circuit and other PMOS transistor both of which are supplied with a power source voltage by a common power source, in the conventional peripheral IC. As shown in FIG. 13A, the PMOS transistor 202 that constitutes the signal output circuit has its source connected to the power source terminal 200. This power source terminal 200 is also connected to other PMOS transistor 313 that constitutes a circuit other than the signal output circuit.

In other words, the power source terminal 200 is usually connected to many MOS transistors as a common power supply portion for all circuit blocks within the semiconductor integrated circuit. FIG. 13B shows this relationship as a layout cross-sectional diagram.

As shown in FIG. 13B, the PMOS transistors 202 and 313 are formed in a common N-well area 301 on a P-type semiconductor substrate 300. The PMOS transistor 202 has a drain and a source formed by P-diffusion areas 306 and 307 respectively, has a back gate formed by an N-diffusion area 305, and has the output terminal 201 and the drain electrically connected to each other by an aluminum wiring 312. The wiring of a gate 308 is omitted from the drawing.

The PMOS transistor 313 has a source and a drain formed by P-diffusion areas 302 and 303 respectively, has a back gate formed by an N-diffusion area 304, and has a wiring drawn from the drain by an aluminum wiring 310. The wiring of a gate 309 is omitted from the drawing. The source and the back gate of these PMOS transistors are connected to each other by a common aluminum wiring 311. This aluminum wiring 311 is connected to the power source terminal 200.

When the supply of the power source voltage has been cut off for energy saving as described above, this means that the power supply to the peripheral IC1 has been cut off by turning OFF a power supply switch 100 as power supply control unit in FIG. 12. However, when the power supply has been cut off in this way, the potentials of all the nodes inside the peripheral IC1 become in an unpredictable state (a high impedance state). In other words, it becomes impossible to guarantee the state of the output voltage of the NOR gate 205 in FIG. 12, and the NMOS transistor 203 is not completely turned OFF.

In the state that the power supply has been cut off as described above, the data bus 6 connected to the output terminal 201 is generally pulled up to the logic level "H" by the pull-up resistor 7. Therefore, there has been a problem in that unnecessary leakage current flows into the peripheral IC1 from this data bus 6 via the NMOS transistor 203 that has been turned OFF in not a completely OFF state.

This means that, in FIG. 13, the signal at the logic level "H" on the data bus 6 flows from the output terminal 201 to the aluminum wiring 312, the P-diffusion area 307, the N-well area 301, the N-diffusion area 305, and to the aluminum wiring 311, in this order. As the aluminum wiring 311 is a power source wiring common to other MOS transistors, the signal at the logic level "H" is transmitted to those other MOS transistors that are connected to this aluminum wiring 311. This means that, in FIG. 13B, a high power source voltage Vcc is practically applied to the source of the other PMOS transistor 313 within the same N-well area 301.

In other words, there has been a problem that when the data bus 6 is at the logic level "H", even when the power source voltage has not been supplied, the substantially high power source voltage Vcc is supplied to some transistors within the peripheral IC1, which results in an unnecessary power consumption and a leakage of the current.

FIG. 14A and FIG. 14B are diagrams for explaining a conventional example of a case where the power source terminal 200 is grounded by the power supply control unit when the power source voltage is not supplied to the peripheral IC1. In FIG. 14A and FIG. 14B, portions common to those in FIG. 13A and FIG. 13B are attached with the same legends, and their explanation will be omitted. In this example, there is a problem that when the data bus 6 is at the logic level "H", the current flows directly from the output terminal 201 to the power source terminal 200, which also results in an unnecessary power consumption and a leakage of the current.

SUMMARY OF THE INVENTION

It is an object of the present invention to provide a semiconductor integrated circuit and a semiconductor integrated circuit system capable of completely turning OFF an NMOS transistor connected to an output terminal when a power source voltage is not supplied in a signal output circuit of a semiconductor integrated circuit, and also capable of completely separating a power source wiring for PMOS transistors that constitute the signal output circuit and that are connected to a power source terminal, from a power source wiring for other transistors that do not constitute the signal output circuit.

The semiconductor integrated circuit according to one aspect of the present invention comprises an output terminal and a signal output circuit. The output terminal is connected to an external circuit or is pulled by a first potential or a second potential. The signal output circuit comprises a first conductive type first MOS transistor that outputs a drain potential as output data to the output terminal, and an output terminal control unit that turns OFF the first MOS transistor according to a control signal.

According to the above invention, an N-type or P-type first conductive first MOS transistor having its drain connected to the output terminal is completely turned OFF according to a control signal. Therefore, even when the power supply to the semiconductor integrated circuit has been cut off, the first MOS transistor does not become in an unstable state. It becomes possible to prevent a leakage current from flowing to the first MOS transistor through the output terminal that has been driven by the first potential or the second potential or that has been pulled at the outside.

The semiconductor integrated circuit according to another aspect of the present invention comprises an output terminal, first and second power source terminals applied with a first potential or a second potential from the outside, and a signal output circuit. The output terminal is connected to an external circuit or is pulled by the first potential or the second potential. The signal output circuit comprises a MOS transistor that applies its drain potential as output data to the output terminal and has a potential of the first power source terminal applied to its source and that is formed in a well area independent of a well area of other MOS transistor to which a potential of the second power source terminal is applied.

According to the above invention, the MOS transistor that is connected to the output terminal in the signal output circuit and applies a voltage supplied from the first power source terminal to the source is formed in a well area independent of a well area of other MOS transistor. Therefore, it is possible to prevent a current from flowing from the output terminal that has been pulled up to a high power source voltage to other MOS transistor via the MOS transistor, for example, in a state that a power source voltage has not been supplied to the semiconductor integrated circuit.

The semiconductor integrated circuit according to still another aspect of the present invention comprises a plurality of output terminals, first and second power source terminals applied with a first potential or a second potential from the outside, and a plurality of signal output circuits. The plurality of output terminals are connected to an external circuit or are pulled by the first potential or the second potential. Each of the plurality of signal output circuits comprises a MOS transistor that applies its drain potential as output data to any one of the plurality of output terminals and has a potential of the first power source terminal applied to its source and that is formed in a well area independent of a well area of other MOS transistor to which a potential of the second power source terminal is applied.

According to the above invention, in each of the plurality of signal output circuits, a MOS transistor that is connected to any one of the plurality of output terminals and applies a power source voltage supplied from the first power source terminal to the source is formed in a well area independent of a well area of other MOS transistor. Therefore, it is possible to prevent a current from flowing from the output terminal that has been pulled up to a high power source voltage to other MOS transistor via the MOS transistor in a state that a power source voltage has not been supplied to the semiconductor integrated circuit.

The semiconductor integrated circuit according to still another aspect of the present invention comprises a bus, first and second power source terminals applied with a first potential or a second potential from the outside, and a plurality of functional circuits. All or a part of the plurality of functional circuits comprises a control terminal for inputting a control signal, an output terminal connected to the bus, a first power source input terminal connected to the first power source terminal, a second power source input terminal connected the second power source terminal, and a signal output circuit. The signal output circuit comprises a first conductive type first MOS transistor that outputs a drain potential as output data to the output terminal, a second conductive type second MOS transistor that has its drain connected to the first MOS transistor and has a potential of the first power source terminal applied to its source and that is formed in a well area independent of a well area of other MOS transistor to which a potential of the second power source terminal is applied, and an output terminal control unit that turns OFF the first MOS transistor when the control signal is active.

According to the above invention, in the signal output circuit of all or a part of the functional circuits, the first MOS transistor having its drain connected to the output terminal is completely turned OFF by the control signal. Further, the second MOS transistor that has its drain connected to the first MOS transistor and that has the power source voltage from the first power source terminal applied to its source is formed in a well area independent of a well area of other MOS transistor. Therefore, even when the power supply to the functional circuit has been cut off, the first MOS transistor does not become in an unstable state. It becomes possible to prevent a leakage current from flowing to the first MOS transistor through the output terminal from the bus that has been pulled up to a high power source voltage. It is also possible to prevent the leakage current from flowing to other MOS transistor via the second MOS transistor.

The semiconductor integrated circuit according to still another aspect of the present invention comprises a bus structured by a plurality of signal lines, first and second power source terminals applied with a first potential or a second potential from the outside, and a plurality of functional circuits. All or a part of the plurality of functional circuits comprises a control terminal for inputting a control signal, a plurality of output terminals connected to the signal lines of the bus at one to one, a first power source input terminal connected to the first power source terminal, and a plurality of signal output circuits. Each of the plurality of signal output circuits comprises a first conductive type first MOS transistor that outputs a drain potential as output data to any one of the plurality of output terminals, a second conductive type second MOS transistor that has its drain connected to the first MOS transistor and has a potential of the first power source terminal applied to its source and that is formed in a well area independent of a well area of other MOS transistor to which a potential of the second power source terminal is applied, and an output terminal control unit that turns OFF the first MOS transistor when the control signal is active.

According to the above invention, in each of the plurality of signal output circuits of all or a part of the functional circuits, the first MOS transistor having its drain connected to any one of the plurality of output terminals is completely turned OFF by the control signal. Further, the second MOS transistor that has its drain connected to the first MOS transistor and that has the power source voltage from the first power source terminal applied to its source is formed in a well area independent of a well area of other MOS transistor. Therefore, even when the power supply to the functional circuit has been cut off, the first MOS transistor does not become in an unstable state. It becomes possible to prevent a leakage current from flowing to the first MOS transistor through the output terminal from the bus that has been pulled up to a high power source voltage. It is also possible to prevent the leakage current from flowing to other MOS transistor via the second MOS transistor.

The semiconductor integrated circuit system according to still another aspect of the present invention comprises the above-described semiconductor integrated circuit, a power supply control unit for controlling a supply of a power source voltage to the semiconductor integrated circuit, and a control signal generating unit for making active the control signal and inputting the control signal to the output terminal control unit when the power source voltage has not been supplied to the semiconductor integrated circuit by the power supply control unit.

According to the above invention, the semiconductor integrated circuit system comprises the semiconductor integrated circuit, the power supply control unit, and the control signal generating unit. In this system, even when the power supply control unit has interrupted the supply of the power source voltage to the semiconductor integrated circuit, the MOS transistor that constitutes the signal output circuit in the semiconductor integrated circuit does not becomes in an unstable state. Thus, it is possible to prevent a leakage current from flowing to the MOS transistor through the output terminal that has been pulled up to a high power source voltage at the outside, for example.

The semiconductor integrated circuit system according to still another aspect of the present invention comprises the above-described semiconductor integrated circuit and a power supply control unit for controlling whether or not the first potential or the second potential is to be given to the first and second power source terminals in the semiconductor integrated circuit. The first and second power source terminals become in an open state when the first potential or the second potential is not given by the power supply control unit.

According to the above invention, the semiconductor integrated circuit system comprises the semiconductor integrated circuit and the power supply control unit. In this system, when a power source voltage has not been supplied to the semiconductor integrated circuit by the power supply control unit, the first and second power source terminals of the semiconductor integrated circuit become in a sate that they are not connected to the outside. Therefore, it is possible to make the first power source terminal and the second power source terminal independent of each other.

Other objects and features of this invention will become apparent from the following description with reference to the accompanying drawings.

BRIEF DESCRIPTION OF THE DRAWINGS

FIG. 5A is a circuit diagram, and

FIG. 5B is a layout cross-sectional diagram of a PMOS transistor that constitutes a signal output circuit in a semiconductor integrated circuit and other PMOS transistor, relating to a fourth embodiment of the invention, wherein both transistors are supplied with a power source voltage by a common power source terminal.

FIG. 13A is a circuit diagram, and

FIG. 13B is a layout cross-sectional diagram of a PMOS transistor that constitutes a signal output circuit in a semiconductor integrated circuit and another PMOS transistor both of which are supplied with a power source voltage by a common power source, in a conventional peripheral IC.

FIG. 14A and FIG. 14B are diagrams for explaining a conventional example of a case where a power source terminal is grounded by power supply control unit when a power source voltage is not supplied to a conventional peripheral IC.

DESCRIPTION OF THE PREFERRED EMBODIMENTS

Preferred embodiments of a semiconductor integrated circuit and a semiconductor integrated circuit system relating to the present invention will be explained in detail below with reference to the drawings. The present invention is not limited by the following embodiments.

Figure 1:
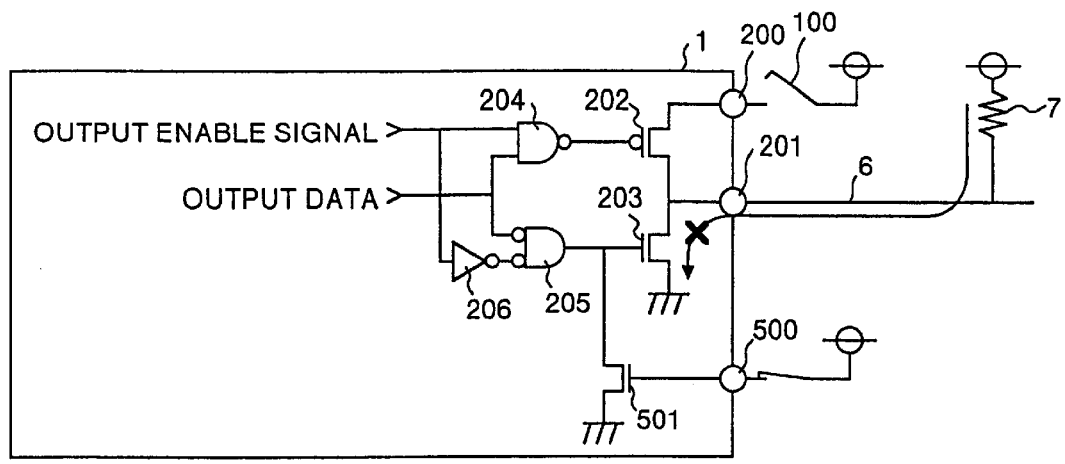
FIG. 1 is a diagram for explaining the operation of a signal output circuit in a semiconductor integrated circuit relating to a first embodiment of the present invention.

A semiconductor integrated circuit relating to a first embodiment will now be explained. FIG. 1 is a diagram for explaining the operation of a signal output circuit in a semiconductor integrated circuit relating to the fist embodiment of the present invention. Sections that have same or similar structure or function to the sections shown in FIG. 12 are attached with the same legends in FIG. 1, and to avoid repetition of explanation, their explanation will be omitted.

Figure 12:
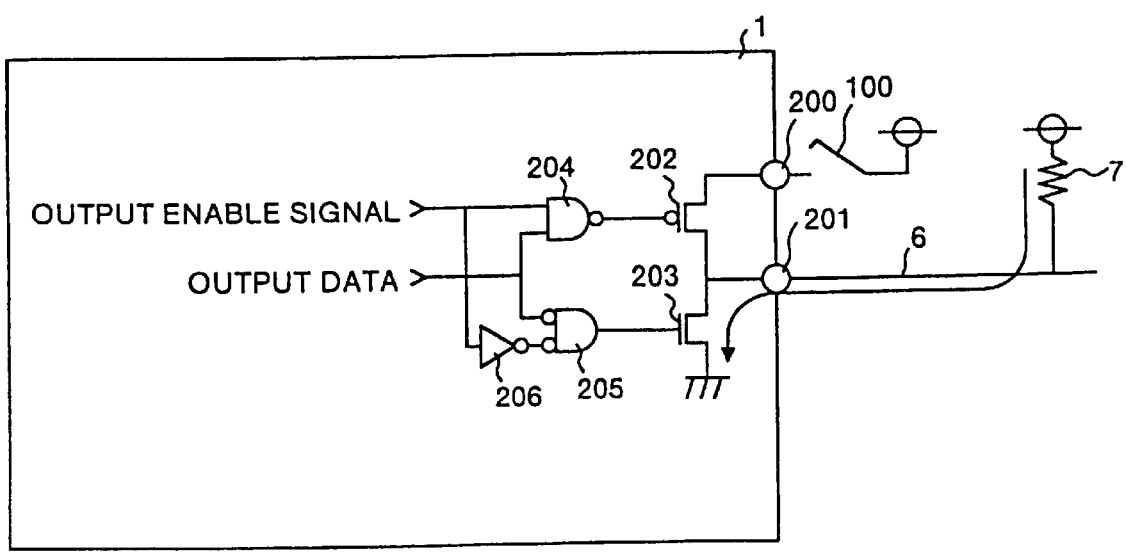
FIG. 12 is a diagram for explaining the operation of a signal output circuit of a conventional peripheral IC.

A semiconductor integrated circuit 1 shown in FIG. 1 is different from the semiconductor integrated circuit shown in FIG. 12 in that a control terminal 500 and an NMOS transistor 501 are added to FIG. 1. The NMOS transistor 501 has its gate connected to the control terminal 500, has its source grounded, and has its drain connected to a gate of an NMOS transistor 203.

When power is not being supplied to the semiconductor integrated circuit 1, a control signal of a high power source voltage Vcc is supplied to the control terminal 500 by external control signal generating unit. Thus, the NMOS transistor 501 is turned ON, and the output node of an NOR gate 205, that is, a gate potential of the NMOS transistor 203 becomes the ground level. At this time, power supply to an NOR gate 205 is also being cut off Therefore, there is no through current flowing between the NOR gate 205 and the NMOS transistor 501.

As explained above, according to the semiconductor integrated circuit relating to the first embodiment, there is no current that leaks from a data bus 6 via the NMOS transistor 203 of the signal output circuit within the semiconductor integrated circuit 1. Therefore, it becomes possible to restrict power consumption in the whole semiconductor integrated circuit system including the power supply control unit and the control signal generating unit.

Figure 2:
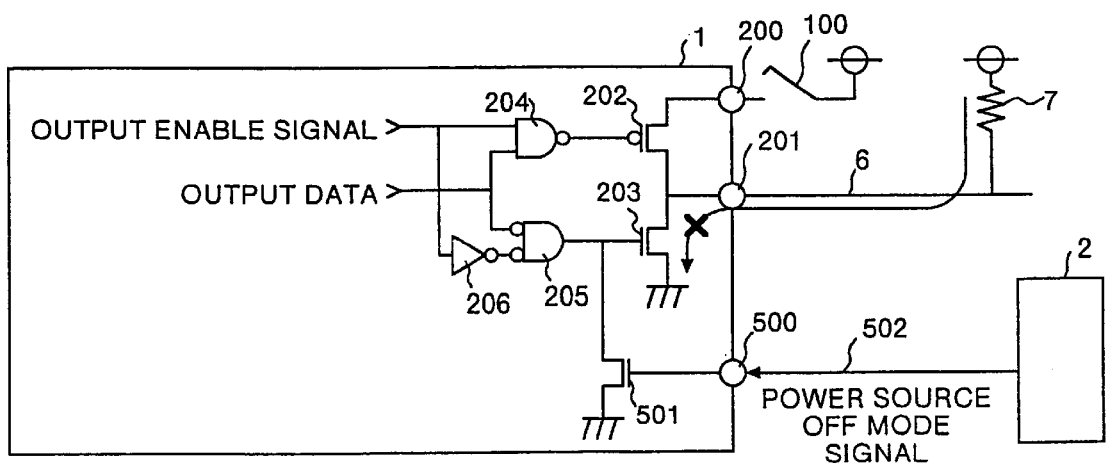
FIG. 2 is a diagram for explaining the operation of a signal output circuit in a semiconductor integrated circuit relating to a second embodiment of the invention.

A semiconductor integrated circuit relating to a second embodiment of the invention will now be explained. FIG. 2 is a diagram for explaining the operation of a signal output circuit in a semiconductor integrated circuit relating to the second embodiment. Sections that have same or similar structure or function to the sections shown in FIG. 1 are attached with the same legends in FIG. 2, and to avoid repetition of explanation, their explanation will be omitted. The semiconductor integrated circuit relating to the second embodiment is different from the semiconductor integrated circuit of the first embodiment in that a control signal to be input to a control terminal 500 is generated as a power source OFF mode signal by other special semiconductor integrated circuit 2 and is controlled by this circuit. The semiconductor integrated circuit system generally has means that has a function for managing the power source of the system, like this semiconductor integrated circuit 2. The semiconductor integrated circuit 2 uses this function as the control signal generating unit.

The power source OFF mode signal 502 becomes at the logic level "H" when a power source voltage is not being supplied to the semiconductor integrated circuit 1, and becomes at the logic level "L" when a power source voltage is being supplied to the semiconductor integrated circuit 1. Based on this arrangement, the semiconductor integrated circuit 2 decides whether the operation is in the power saving mode or not.

As explained above, according to the semiconductor integrated circuit relating to the second embodiment, there is an effect similar to that of the first embodiment. Further, as the existing semiconductor integrated circuit 2 is utilized as the control signal generating unit, it is possible to restrict an increase in the circuit scale of the semiconductor integrated circuit as a whole.

Figure 3:
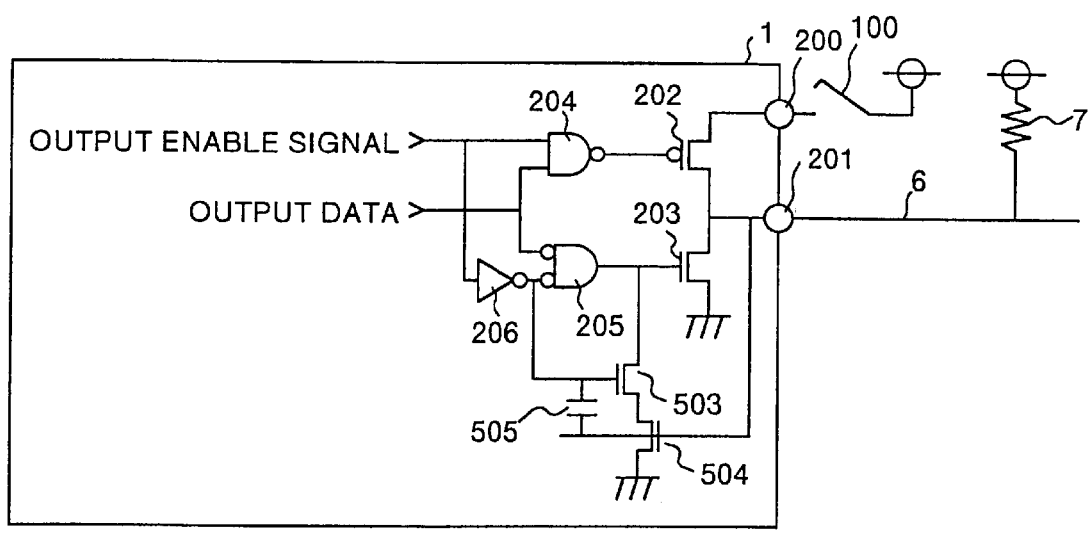
FIG. 3 is a diagram for explaining the operation of a signal output circuit in a semiconductor integrated circuit relating to a third embodiment of the invention.

A semiconductor integrated circuit relating to a third embodiment of the invention will be now explained. FIG. 3 is a diagram for explaining the operation of a signal output circuit in a semiconductor integrated circuit relating to the third embodiment. Sections that have same or similar structure or function to the sections shown in FIG. 1 are attached with the same legends in FIG. 3, and to avoid repetition of explanation, their explanation will be omitted.

A semiconductor integrated circuit 1 shown in FIG. 3 is different from that shown in FIG. 1 in that the control terminal 500 is excluded, and NMOS transistors 503 and 504 are added to FIG. 3. The NMOS transistor 503 has its gate connected to an output terminal of an inverter 206, and has its drain connected to a gate of an NMOS transistor 203. The NMOS transistor 504 has its gate connected to an output terminal 201, has its drain connected to a source of the NMOS transistor 503, and has its source grounded.

The semiconductor integrated circuit relating to the third embodiment is characterized in that the semiconductor integrated circuit generates the control signal explained in the first embodiment, based on an output enable signal and a potential of the output terminal, and excludes the control terminal 500.

The operation of the semiconductor integrated circuit relating to the third embodiment will be explained next. When power is not being supplied to the semiconductor integrated circuit 1 and also when the data bus 6 is at the logic level "H", the NMOS transistor 504 becomes in the ON state. At this time, as there is no supply of a power source voltage to the semiconductor integrated circuit 1, the gate of the NMOS transistor 503 becomes undefined, and the NMOS transistor 503 is not completely turned OFF. Therefore, the current at the gate of the NMOS transistor 203 is discharged, and thus, the NMOS transistor 203 necessarily becomes in the OFF state.

Figure 4:
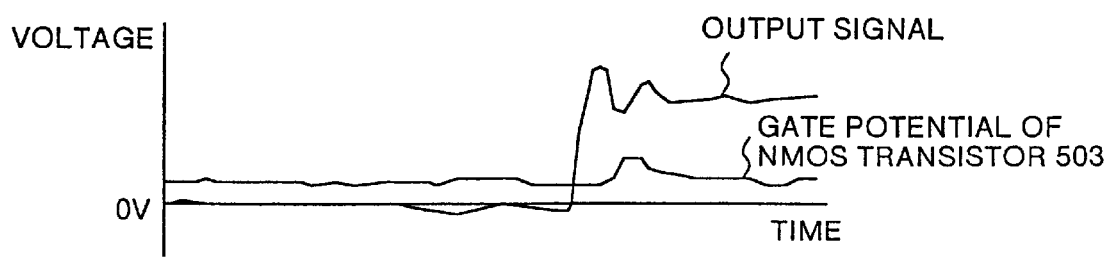
FIG. 4 is a diagram for explaining the operation of a signal output circuit based on an addition of a capacitor in the semiconductor integrated circuit relating to the third embodiment of the invention.

Further, as shown in the drawing, a capacitor 505 for intentionally adding a coupling capacity is provided between the gate of the NMOS transistor 503 and the output terminal. FIG. 4 is a diagram for explaining the operation of a signal output circuit based on the addition of the capacitor 505. As shown in FIG. 4, when the signal on the data bus 6 has risen from the logic level "L" to "H", the potential of the NMOS transistor 503 of which voltage level is undefined slightly increase 5 to a higher potential side by the coupling noise of the capacitor 505. Based on this, the resistance between the source and the drain of the NMOS transistor 503 is further lowered. Thus, it becomes possible to promote the discharging from the gate of the NMOS transistor 203.

Further, when the channel of an NMOS transistor not shown that constitutes the inverter 206 is formed to have an intentionally larger length, it becomes possible to restrict a leakage current of the NMOS transistor of the inverter 206 as far as possible. Based on this arrangement, it becomes possible to prevent a gate potential of the NMOS transistor 503 from completely falling to the ground level.

As explained above, according to the semiconductor integrated circuit relating to the third embodiment, there is an effect similar to that of the first embodiment. Further, as the control signal is generated based on the output enable signal and the potential of the output terminal, it is possible to exclude the control terminal that inputs a control signal from the outside.

A semiconductor integrated circuit relating to a fourth embodiment of the invention will now be explained. FIG. 5A is a circuit diagram and FIG. 5B is a layout cross-sectional diagram of a PMOS transistor that constitutes a signal output circuit in a semiconductor integrated circuit and other PMOS transistor, relating to a fourth embodiment of the invention, wherein both transistors are supplied with a power source voltage by a common power source terminal. Sections that have same or similar structure or function to the sections shown in FIG. 13A and FIG. 13B are attached with the same legends in FIG. 5A and FIG. 5B, and to avoid repetition of explanation, their explanation will be omitted.

FIG. 5A is differs from FIG. 13A in following points. That is, a power source terminal 200 connected to the source of a PMOS transistor 202 that constitutes a signal output circuit is provided independent of a power source terminal 602 connected to the source of other PMOS transistor 313 that constitutes a circuit other than the signal output circuit.

In FIG. 5A and FIG. 5B, the source of a PMOS transistor 202 that constitutes a signal output circuit is connected with the power source terminal 200 that supplies a power source voltage Vcc2 by an aluminum wiring 603. The source of a PMOS transistor 313 that constitutes a circuit other than the signal output circuit is connected with the power source terminal 602 that supplies a power source voltage Vcc1 by an aluminum wiring 604.

As shown in FIG. 5B, the PMOS transistor 202 and the PMOS transistor 313 are formed within mutually independent N-well areas 301 and 601 respectively.

Therefore, when a power source voltage is not supplied to the power source terminals 200 and 602 by power source switches 100 and 110 respectively, a signal at the logic level "H" on the data bus 6 is transmitted from an output terminal 201 to an aluminum wiring 312, a P-diffusion area 307, the N-well area 301, an N-diffusion area 305, and to the aluminum wiring 311 in this order. However, as the aluminum wiring 311, the aluminum wiring 600 of the PMOS transistor 313, and the N-well area 601 are separated from each other, the signal at the logic level "H" is not transmitted to the PMOS transistor 313 unlike the conventional system.

As explained above, according to the semiconductor integrated circuit relating to the fourth embodiment, there is no current that leaks from the data bus 6 to other MOS transistor via the PMOS transistor 202 of the signal output circuit within the semiconductor integrated circuit 1. Therefore, it becomes possible to restrict power consumption in the whole semiconductor integrated circuit system including the power supply control unit and the control signal generating unit.

Figure 6:
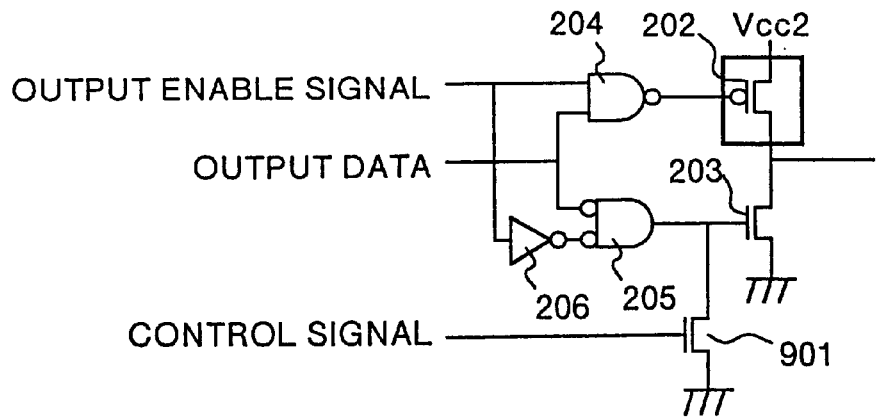
FIG. 6 is a diagram showing another example of a signal output circuit in the semiconductor integrated circuit relating to the fourth embodiment of the invention.
Figure 7:
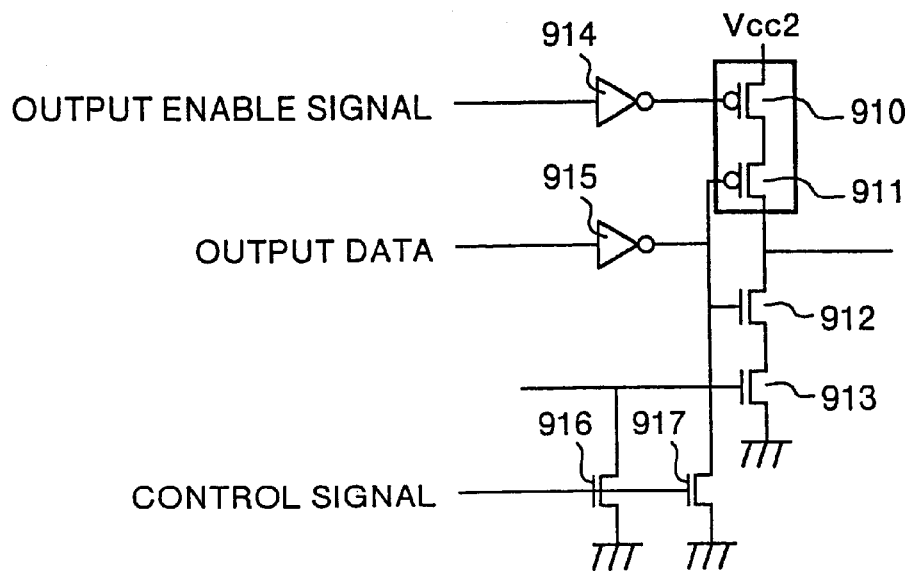
FIG. 7 is a diagram showing another example of a signal output circuit in the semiconductor integrated circuit relating to the fourth embodiment of the invention.
Figure 8:
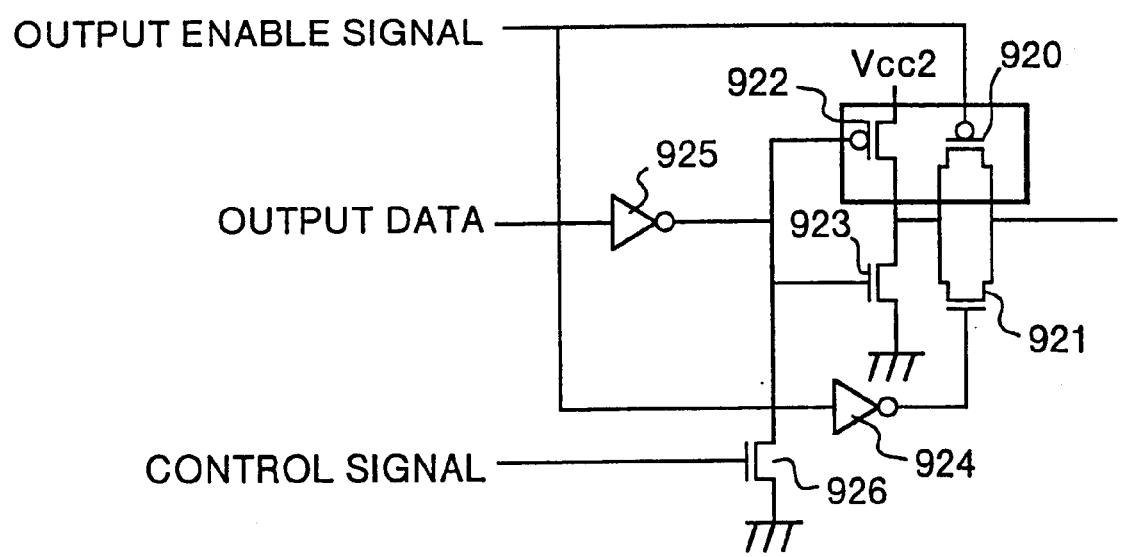
FIG. 8 is a diagram showing still another example of a signal output circuit in the semiconductor integrated circuit relating to the fourth embodiment of the invention.

The above-described concept of energy saving can also be applied to other circuit structure that determines a logic state of the output data by applying a high power source voltage to the output terminal 201. FIGS. 6 to 8 are circuit diagrams showing other examples of a signal output circuit. In each drawing, only a PMOS transistor at a final stage encircled by a thick line is formed within a separate N-well region so as to be separated from other PMOS transistor as shown in FIG. 5. A power source voltage Vcc2 is transmitted to this N-well area, and the above-described power source voltage Vcc1 is transmitted to other transistors.

The circuit shown in FIG. 6 as a first circuit example has the same structure as that of the signal output circuit in FIG. 1, and is attached with the same legends as those in FIG. 1. However, an NMOS transistor 901 substitutes the NMOS transistor 501 shown in FIG. 1. A control signal to be input to the gate of this NMOS transistor 901 may be any one of the control signals used in the first to third embodiments.

FIG. 7 shows a second example of such circuit. This circuit consists of a PMOS transistor 910 having the power source voltage Vcc2 applied to its source, a PMOS transistor 911 having its source connected to a drain of the PMOS transistor 910 and having its drain connected to an output terminal 201, an NMOS transistor 912 having its drain connected to the output terminal 201, an NMOS transistor 913 having its drain connected to the source of the NMOS transistor 912 and having its source grounded, an NMOS transistor 917 having the control signal input to its gate, having its drain connected to a gate of the PMOS transistor 911, and having its source grounded, an NMOS transistor 916 having the control signal input to its gate, having its drain connected to a gate of the NMOS transistor 913, and having its source grounded, an inverter 914 having an output enable, signal as its input and having its output terminal connected to the PMOS transistor 910, and an inverter 915 having an output data as its input and having its output terminal connected to the gates of the PMOS transistor 911 and the NMOS transistor 912 respectively.

FIG. 8 shows a third example of such circuit. This circuit consists of a PMOS transistor 922 having the power source voltage Vcc2 input to its source, a PMOS transistor 920 having an output enable signal input to its gate, an NMOS transistor 912 having its drain connected to an output terminal 201, an NMOS transistor 923 having its drain connected to a drain of the PMOS transistor 922, and having its source grounded, an NMOS transistor 926 having the control signal input to its gate, having its drain connected to gates of the PMOS transistor 922 and the NMOS transistor 923 respectively, and having its source grounded, an NMOS transistor 921, an inverter 924 having an output data as its input, and having its output terminal connected to a gate of the NMOS transistor 921, and an inverter 925 having an output enable signal as its input, and having its output terminal connected to the gates of the PMOS transistor 922 and the NMOS transistor 923 respectively. The PMOS transistor 920 and the NMOS transistor 921 exist between the respective drains of the PMOS transistor 922 and the NMOS transistor 923 and the output terminal 201, thereby to structure a transfer gate.

Figure 9:
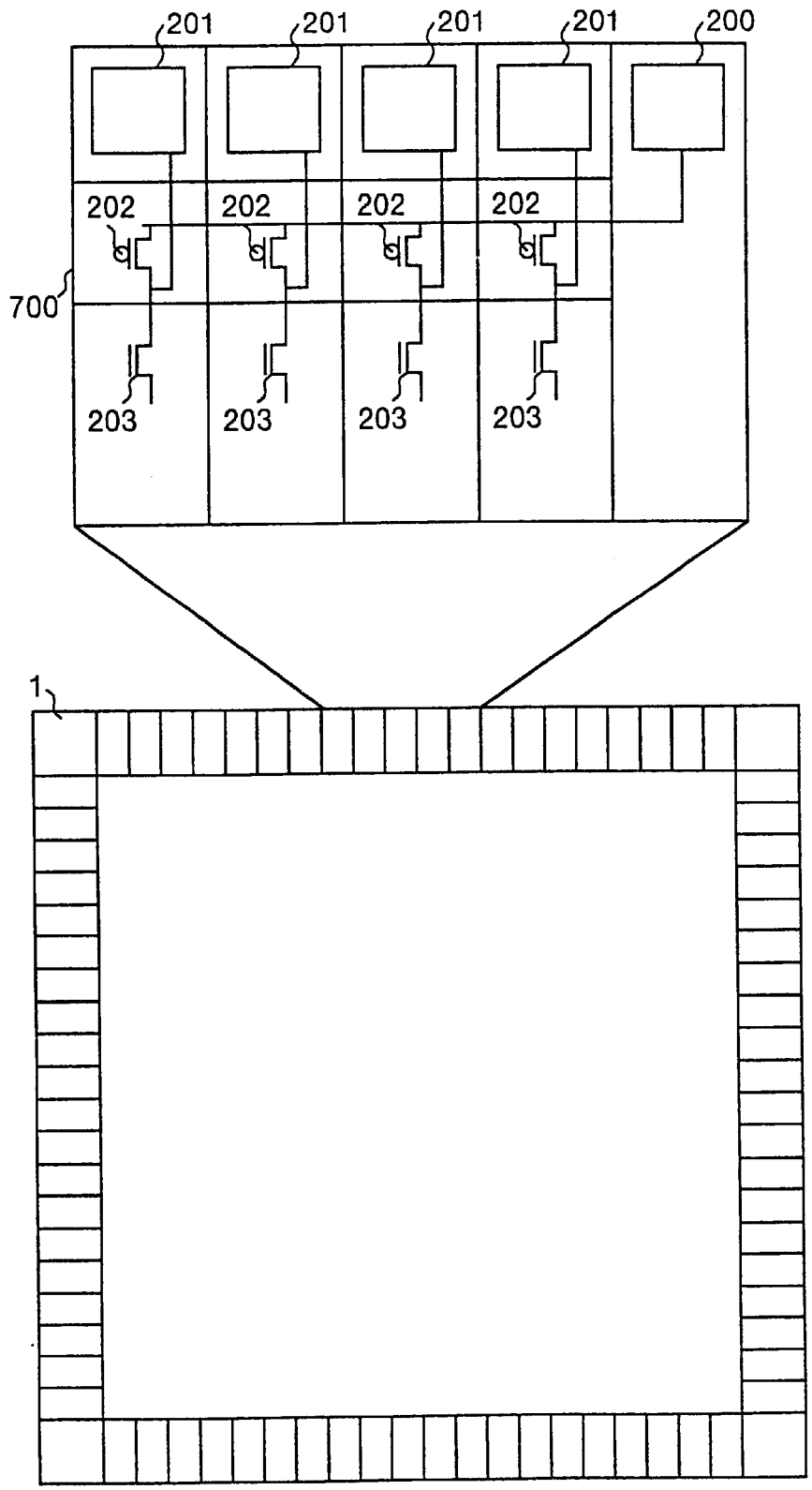
FIG. 9 is a diagram for explaining the operation of a signal output circuit in a semiconductor integrated circuit relating to a fifth embodiment of the invention.

A semiconductor integrated circuit relating to a fifth embodiment of the invention will now be explained. FIG. 9 is a diagram for explaining the operation of a signal output circuit in a semiconductor integrated circuit relating to the fifth embodiment. The semiconductor integrated circuit relating to the fifth embodiment is characterized as follows. For a plurality of signal output circuits provided corresponding to a plurality of output terminals 201, PMOS transistors that correspond to the PMOS transistor 202 shown in FIG. 5 are grouped into one and are formed in the same N-well area 700.

As shown in FIG. 9, within the plurality of signal output circuits, the sources of the PMOS transistors formed within the N-well area are supplied with a power source voltage by a common power source terminal 200.

As explained above, according to the semiconductor integrated circuit relating to the fifth embodiment, it is possible to share the power source terminal 200 in the signal output circuits that are provided corresponding to the plurality of output terminals 201. It is also possible to separate PMOS transistors 202 from other circuits in an efficient layout.

Figure 10:
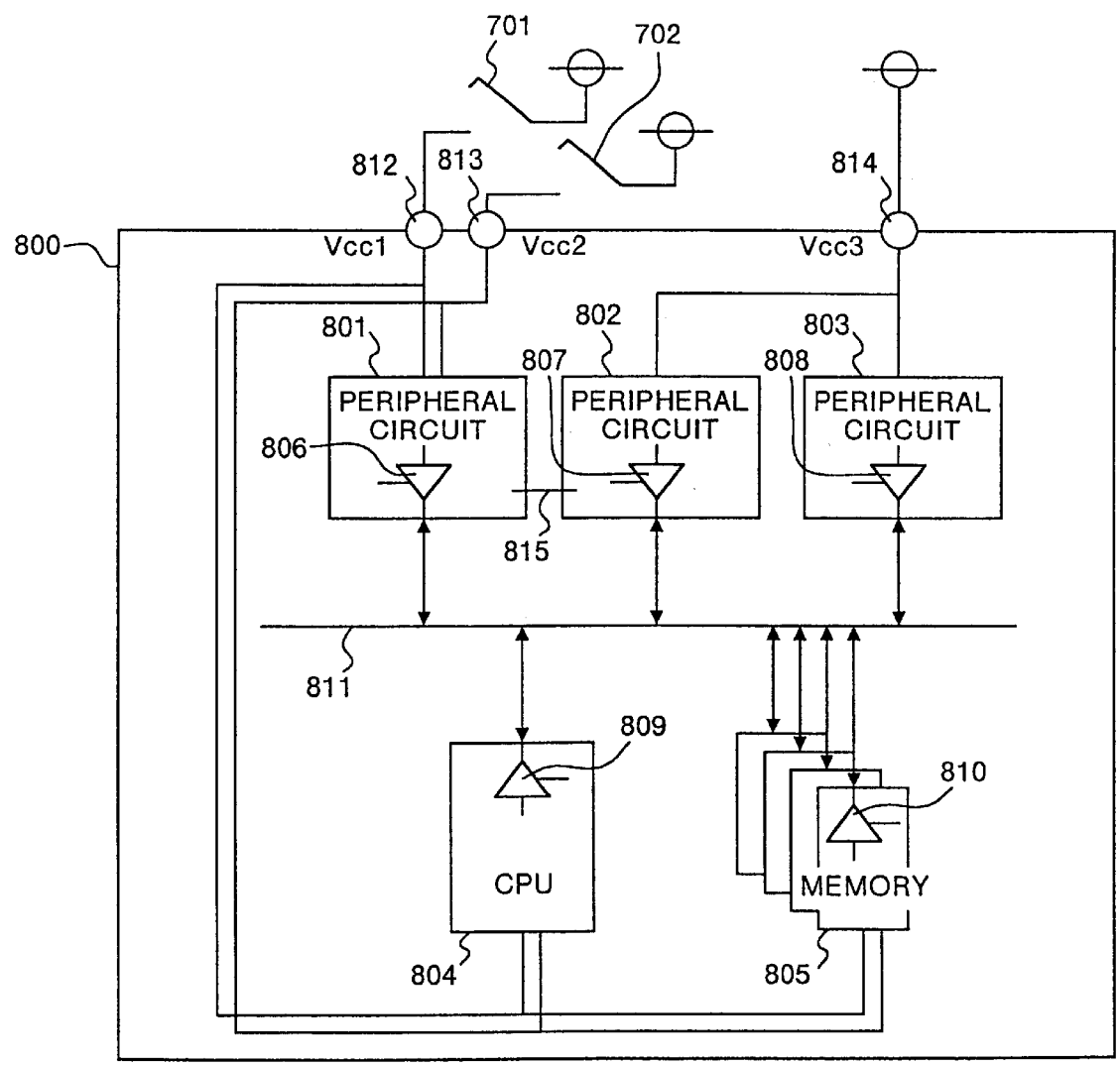
FIG. 10 is a block diagram showing a semiconductor integrated circuit relating to a sixth embodiment of the invention.
Figure 11:
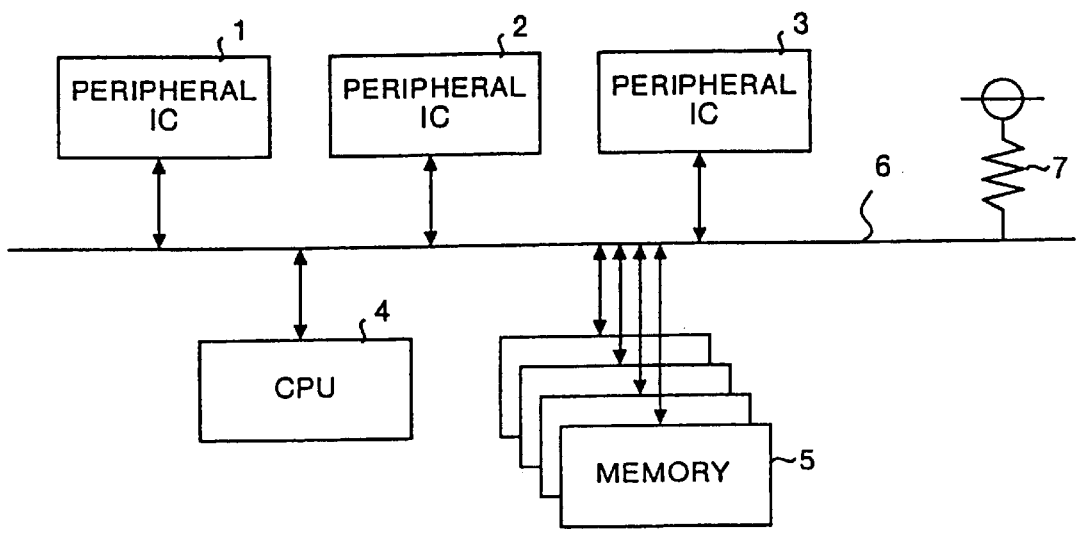
FIG. 11 is a block diagram showing a schematic configuration of a conventional representative semiconductor integrated circuit system.

A semiconductor integrated circuit relating to a sixth embodiment of the invention will now be explained. FIG. 10 is a block diagram showing a semiconductor integrated circuit relating to the sixth embodiment. As shown in FIG. 10, a semiconductor integrated circuit 800 relating to the sixth embodiment consists of functional circuits 801 to 805 that are equipped with a signal output circuit similar to that explained in the fourth or fifth embodiment. In FIG. 10, when the semiconductor integrated circuit 800 has been set to a low power consumption state, this circuit is not supplied with the power source voltage Vcc1 and Vcc2 from power source terminals 812 and 813 respectively, but a power source voltage Vcc3 is supplied from only a power source terminal 814.

In other words, a power source voltage is not supplied to a peripheral circuit 801, a CPU 804 and a memory 805. On the other hand, peripheral circuits 802 and 803 are supplied with a power source voltage and are in an operating state. A control signal 815 is at the logic level "H" during a low power consumption state, and is at the logic level "L" in other states.

Assume that a data transfer is to be carried out between the peripheral circuits 802 and 803 via a data bus 811 when the semiconductor integrated circuit 800 is in the state of low power consumption. In this case, even when the data bus 811 becomes at the logic level "H", the gate potential of the NMOS transistor of the signal output circuit in each functional circuit is fixed at the "L" level by the control signal 815. Therefore, each circuit is in the completely OFF state, and no leakage current flows. Further, as the power source is completely separated from the PMOS transistor of the signal output circuit, the power source voltage is not transmitted to other circuits like the peripheral circuit 801, the CPU 804 and the memory 805.

As explained above, according to the semiconductor integrated circuit relating to the sixth embodiment, even when there exist a functional circuit that is supplied with a power source voltage and a functional circuit that is not supplied with a power source voltage within the same semiconductor integrated circuit, it is possible to prevent an unnecessary power consumption within the functional circuit that is not supplied with the power source voltage. Therefore, it is possible to restrict power consumption as a whole.

In the above first to sixth embodiments, it is assumed that the output terminal 201 is pulled up by a power source voltage at the outside. However, it is also possible to obtain a similar effect when the output terminal 201 is driven by a power source voltage by an external circuit.

Further, in the above first to sixth embodiments, it is assumed that a signal output circuit of the semiconductor integrated circuit is supplied with a power source voltage from the power source terminal 200. However, it is also possible to apply the concept of the present invention to a signal output circuit of the semiconductor integrated circuit the power supply to which is cut off by grounding in a state that the power source voltage is always being supplied. In this case, in the circuit shown in FIG. 1, for example, the PMOS transistor 202 is substituted by an NMOS transistor of which source has been connected to a ground terminal, and the NMOS transistor 203 is substituted by a PMOS transistor having the power source potential input to its source. Further, the NMOS transistor 501 is substituted by a PMOS transistor having the power source potential input to its source, and the logic structure of each of the logic gates 204 to 206 needs to be reversed.

In the structure having the PMOS transistor and the NMOS transistors reversed together in the manner as described above, the effect of the present invention can be enjoyed for the first time when the output terminal 201 has been pulled down to the ground potential at the outside or when the output terminal 201 has been driven by the ground potential by the external circuit.

As explained above, according to the present invention, an N-type or P-type first conductive first MOS transistor having its drain connected to the output terminal is completely turned OFF according to a control signal. Therefore, even when the power supply to the semiconductor integrated circuit has been cut off, the first MOS transistor does not become in an unstable state. It becomes possible to prevent a leakage current from flowing to the first MOS transistor through the output terminal that has been driven by the first potential or the second potential or that has been pulled at the outside. As a result, there is an effect that it is possible to decrease power consumption.

Further, it is possible to realize an ON/OFF control of the first MOS transistor having its drain connected to the output terminal by turning ON/OFF the new separate second MOS transistor according to a control signal. Therefore, there is an effect that it is possible to restrict the cost increase without substantially increasing the area of the signal output circuit.

Further, the new separate second MOS transistor and third MOS transistor are turned ON/OFF according to the output enable signal generated inside the semiconductor integrated circuit or the output enable signal input from the outside and the state of the potential of the output terminal. Therefore, it is possible to realize the ON/OFF control of the first MOS transistor having its drain connected to the output terminal. As a result, there is an effect that it is possible to control the NMOS transistor inside the semiconductor integrated circuit without providing a terminal for inputting a new control signal.

Further, the capacitor for adding a coupling capacitor is provided between the output terminal and the gate of the second MOS transistor. Therefore, when the potential state of the output terminal has shifted from the logic level "L" to "H", the potential of the gate of the second MOS transistor increases slightly to a higher potential side due to coupling noise. Thus, a source-drain resistance of the second MOS transistor is lowered, and it becomes possible to promote the discharging at the gate of the second MOS transistor. As a result, there is an effect that it is possible to completely turn OFF the second MOS transistor.

Further, the inverter is constructed of the MOS transistor having a larger channel length than that of the MOS transistor that constitutes a general inverter generates the control signal. This control signal is then input to the gate of the second MOS transistor. Therefore, it is possible to reduce a leakage current that is generated by the inverter itself. As a result, there is an effect that it is possible to save energy.

Further, the MOS transistor that is connected to the output terminal in the signal output circuit and applies a voltage supplied from the first power source terminal to the source is formed in a well area independent of a well area of other MOS transistor. Therefore, it is possible to prevent a current from flowing from the output terminal that has been pulled up to a high power source voltage to other MOS transistor via the MOS transistor, for example, in a state that a power source voltage has not been supplied to the semiconductor integrated circuit. As a result, there is an effect that it is possible to reduce power consumption.

Further, in each of the plurality of signal output circuits, a MOS transistor that is connected to any one of the plurality of output terminals and applies a power source voltage supplied from the first power source terminal to the source is formed in a well area independent of a well area of other MOS transistor. Therefore, it is possible to prevent a current from flowing from the output terminal that has been pulled up to a high power source voltage to other MOS transistor via the MOS transistor in a state that a power source voltage has not been supplied to the semiconductor integrated circuit. As a result, there is an effect that it is possible to reduce power consumption.

Further, in the signal output circuit of all or a part of the functional circuits, the first MOS transistor having its drain connected to the output terminal is completely turned OFF by the control signal. Further, the second MOS transistor that has its drain connected to the first MOS transistor and that has the power source voltage from the first power source terminal applied to its source is formed in a well area independent of a well area of other MOS transistor. Therefore, even when the power supply to the functional circuit has been cut off, the first MOS transistor does not become in an unstable state. It becomes possible to prevent a leakage current from flowing to the first MOS transistor through the output terminal from the bus that has been pulled up to a high power source voltage. It is also possible to prevent the leakage current from flowing to other MOS transistor via the second MOS transistor. As a result, there is an effect that it is possible to reduce power consumption.

Further, in each of the plurality of signal output circuits of all or a part of the functional circuits, the first MOS transistor having its drain connected to any one of the plurality of output terminals is completely turned OFF by the control signal. Further, the second MOS transistor that has its drain connected to the first MOS transistor and that has the power source voltage from the first power source terminal applied to its source is formed in a well area independent of a well area of other MOS transistor. Therefore, even when the power supply to the functional circuit has been cut off, the first MOS transistor does not become in an unstable state. It becomes possible to prevent a leakage current from flowing to the first MOS transistor through the output terminal from the bus that has been pulled up to a high power source voltage. It is also possible to prevent the leakage current from flowing to other MOS transistor via the second MOS transistor. As a result, there is an effect that it is possible to reduce power consumption.

Further, the first potential and the second potential are a power source voltage and a ground voltage respectively. Therefore, it is possible to prevent a current leakage via the output terminal even when a supply of the power source voltage to the semiconductor integrated circuit has been cut off in a state that the output terminal has been pulled down or pulled up or when the power source voltage has not been obtained because the semiconductor integrated circuit has not been grounded. As a result, there is an effect that it is possible to reduce power consumption.

Further, the semiconductor integrated circuit system comprises the semiconductor integrated circuit, the power supply control unit, and the control signal generating unit. In this system, even when the power supply control unit has interrupted the supply of the power source voltage to the semiconductor integrated circuit, the MOS transistor that constitutes the signal output circuit in the semiconductor integrated circuit does not becomes in an unstable state. Thus, it is possible to prevent a leakage current from flowing to the MOS transistor through the output terminal that has been pulled up to a high power source voltage at the outside, for example. As a result, there is an effect that it is possible to reduce power consumption.

Further, the semiconductor integrated circuit system comprises the semiconductor integrated circuit and the power supply control unit. In this system, when a power source voltage has not been supplied to the semiconductor integrated circuit by the power supply control unit, the first and second power source terminals of the semiconductor integrated circuit become in a sate that they are not connected to the outside. Therefore, it is possible to make the first power source terminal and the second power source terminal independent of each other. As a result, there is an effect that it is possible to prevent an unnecessary current flow to and from the outside, and it is possible to reduce power consumption.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit comprising:

an output terminal; and a signal output circuit, wherein the signal output circuit comprises a first MOS transistor that outputs its drain potential as output data to the output terminal; and an output terminal control unit that turns OFF the first MOS transistor according to a control signal, the output terminal control unit comprising a second MOS transistor having a drain connected to a gate of the first MOS transistor and a gate receiving the control signal, and a third MOS transistor having a drain connected to a source of the second MOS transistor, and a gate connected to the output terminal, and the control signal is generated based on an output enable signal for permitting output of output data from the output terminal.

2. The semiconductor integrated circuit according to claim 1, including a coupling capacitor provided between the output terminal and the gate of the second MOS transistor.

3. The semiconductor integrated circuit according to claim 1 further comprising an inverter that receives an output enable signal for permitting output of output data from the output terminal and that outputs the control signal as an output signal, an MOS transistor of the inverter having a larger channel length than an MOS transistor of a conventional inverter.

4. A semiconductor integrated circuit comprising:
a plurality of output terminals;
first and second power source terminals to which are respectively, selectively applied a first potential and a second potential; and
a plurality of signal output circuits, wherein each of the plurality of signal output circuits comprises a MOS transistor having a source, a gate, and a drain and that applies its drain potential as output data to any one of the plurality of output terminals, has a potential of the first power source terminal applied to its source, and is located in a first well area of a semiconductor substrate independent of a second well area of the semiconductor substrate including another MOS transistor to which a potential of the second power source terminal is applied.

5. The semiconductor integrated circuit according to claim 4, wherein the first and second potentials are the same potential.

6. A semiconductor integrated circuit comprising:
a bus;
first and second power source terminals to which are respectively, selectively applied a first potential and a second potential; and
a plurality of functional circuits, wherein at least some of the plurality of functional circuits comprise
a control terminal for inputting a control signal,
an output terminal connected to the bus,
a first power source input terminal connected to a first power source terminal, and
a second power source input terminal connected a second power source terminal; and
a signal output circuit comprising
a first MOS transistor that outputs a drain potential as output data to the output terminal,
a second MOS transistor having a drain connected to the first MOS transistor, having a source to which the potential of the first power source terminal is applied, and that is located in a first well area of the semiconductor substrate independent of a second well area in the semiconductor substrate including another MOS transistor to which a potential of the second power source terminal is applied, and
an output terminal control unit that turns OFF the first MOS transistor when the control signal is active.

7. The semiconductor integrated circuit according to claim 6, wherein the first and second potentials are the same potential.

8. A semiconductor integrated circuit comprising:
a bus including a plurality of signal lines;
first and second power source terminals to which are respectively, selectively applied a first potential and a second potential; and
a plurality of functional circuits, wherein at least some of the plurality of functional circuits comprise
a control terminal for receiving a control signal,
a plurality of output terminals respectively one-to-one connected to the signal lines of the bus, and
a first power source input terminal connected to the first power source terminal; and
a plurality of signal output circuits, wherein each of the plurality of signal output circuits comprises
a first MOS transistor that outputs a drain potential as output data to any one of the plurality of output terminals,
a second MOS transistor having a drain connected to the first MOS transistor and a source receiving a potential of the first power source terminal, and is located in a well area of a semiconductor substrate independent of a second well area of the semiconductor substrate including another MOS transistor to which a potential of the second power source terminal is applied, and
an output terminal control unit that turns OFF the first MOS transistor when the control signal is active.

9. The semiconductor integrated circuit according to claim 8, wherein the first and second potentials are the same potential.

10. A semiconductor integrated circuit system comprising:
a semiconductor integrated circuit having an output terminal and a signal output circuit, wherein the signal output circuit comprises
a first MOS transistor that outputs a drain potential as output data to the output terminal, and
an output terminal control unit that turns OFF the first MOS transistor according to a control signal;
a power supply control unit which controls a supply of a power source voltage to the semiconductor integrated circuit; and
a control signal generating unit which makes active the control signal and supplies the control signal to the output terminal control unit when the power source voltage has not been supplied to the semiconductor integrated circuit by the power supply control unit.

11. A semiconductor integrated circuit system comprising:
a semiconductor integrated circuit having an output terminal;
first and second power source terminals to which are respectively, selectively applied a first potential and a second potential; and
a signal output circuit, wherein the signal output circuit comprises
an MOS transistor having a source, a gate, and a drain and that applies its drain output as output data to the output terminal, has a potential of the first power source terminal applied to its source, and is located in a first well area of a semiconductor substrate independent of a second well area of the semiconductor substrate including another MOS transistor to which a potential of the second power source terminal is applied, and
a power supply control unit which controls whether the first potential the second potential is applied to the first and second power source terminals in the semiconductor integrated circuit, wherein the first and second power source terminals are open when the first potential or the second potential is not applied by the power supply control unit.

12. A semiconductor integrated circuit system comprising:
a semiconductor integrated circuit having a plurality of output terminals;
first and second power source terminals to which are respectively, selectively applied a first potential and a second potential; and
a plurality of signal output circuits, wherein each of the plurality of signal output circuits comprises an MOS transistor having a source, a gate, and a drain and that applies its drain potential as output data to any one of the plurality of output terminals, has a potential of the first power source terminal applied to its source, and is located in a first well area of a semiconductor substrate independent of a second well area of the semiconductor substrate including another MOS transistor to which a potential of the second power source terminal is applied, and a power supply control unit which controls whether the first potential or the second potential is applied to the first and second power source terminals in the semiconductor integrated circuit, wherein the first and second power source terminals are in an open state when the first potential or the second potential is not applied by the power supply control unit.

* * * * *